United States Patent [19]
Chan et al.

[11] Patent Number: 5,508,227
[45] Date of Patent: Apr. 16, 1996

[54] PLASMA ION IMPLANTATION HYDROGENATION PROCESS UTILIZING VOLTAGE PULSE APPLIED TO SUBSTRATE

[75] Inventors: Chung Chan, Newton; Shu Qin, Jamaica Plain, both of Mass.

[73] Assignee: Northeastern University, Boston, Mass.

[21] Appl. No.: 255,523

[22] Filed: Jun. 8, 1994

[51] Int. Cl.$^6$ .................. H01L 21/263; H01L 21/326
[52] U.S. Cl. .................. 437/172; 437/173; 437/937
[58] Field of Search .................. 437/101, 173, 437/937, 172, 41 TFT, 40 TFT; 156/345; 118/723 MS, 723 E

[56] References Cited

U.S. PATENT DOCUMENTS

| | | | |
|---|---|---|---|
| 4,764,394 | 8/1988 | Conrad | 427/38 |
| 4,891,118 | 1/1990 | Ooiwa et al. | 204/298 |
| 5,250,444 | 10/1993 | Khan et al. | 437/24 |
| 5,281,546 | 1/1994 | Possin et al. | 437/40 |
| 5,354,381 | 10/1994 | Sheng | 118/723 E |

FOREIGN PATENT DOCUMENTS 9318201  9/1993  WIPO.

OTHER PUBLICATIONS

Nuclear Fusion, "Gas Fuelling Of RF–Sustained Tandem Mirror End Plugs", by C. Chan, et al., vol. 24, No. 1, 1984, pp. 103–113.

Plasma Sources Sci. Tecnol. 1, "Energy Distribution Of Boron Ions During Plasma Immersion Ion Implantation", by S. Qin, et al., 1992, pp. 1–6.

IEEE Transactions on Electron Devices, "Plasma Immersion Ion Implantation Doping Using A Microwave Multipolar Bucket Plasma", by S. Qin, et al., vol. 39, No. 10, Oct. 1992, pp. 2354–2358.

*Accept and Appear in March Issue of Journal of Electronic Materials*, "An Evaluation Of Contamination From Plasma Immersion Ion Implantation On Silicon Device Characteristics", by S. Qin, et al., vol. 23, 1994, pp. 1–14.

*IEEE Transactions on Plasma Science*, "The Response Of A Microwave Multipolar Bucket Plasma To A High Voltage Pulse," by S. Qin, et al., vol. 19, No. 6, Dec. 1991, pp. 569–571.

*Solid State Technology*, "The Status Of Simox Technology", by M. Guerra, Nov. 1990, pp. 75–78.

Primary Examiner—George Fourson
Assistant Examiner—Richard A. Booth
Attorney, Agent, or Firm—Weingarten, Schurgin, Gagnebin & Hayes

[57] ABSTRACT

A method of hydrogenating a thin film semiconductor wafer and an apparatus for performing the method. In one embodiment the method comprises the steps applying a pulsed potential having a predetermined amplitude, a predetermined repetition rate and a predetermined pulse duration to the thin film semiconductor wafer while exposing the thin film semiconductor wafer to a hydrogen plasma. The method is especially applicable to the formation of thin film transistors in flat display panels.

11 Claims, 4 Drawing Sheets

| TFT parameter | nMOS | | | pMOS | | |
|---|---|---|---|---|---|---|
| | as fab. | after PII | 15' ann. | as fab. | after PII | 15' ann. |
| $\mu_{eff}$ (cm$^2$/Vs) | 1.99 | 5.4 | 20 | 0.549 | 0.422 | 2.31 |
| $V_{th}$ (V) | 15.8 | 12.6 | 6.9 | -19.4 | -18.9 | -16.2 |
| S (V/dec) | 2 | 2.21 | 1.8 | 2.23 | 1.77 | 1.51 |

| TFT parameter | nMOS | | | pMOS | | |
|---|---|---|---|---|---|---|
| | as fab. | after PII | 10' ann. | as fab. | after PII | 10' ann. |
| $\mu_{eff}$ (cm$^2$/Vs) | 2.98 | 10.96 | 18.5 | 1.48 | 3.12 | 6.78 |
| $V_{th}$ (V) | 15.0 | 5.3 | 7.76 | -18.0 | -15.6 | -14.1 |
| S (V/dec) | 2.28 | 1.36 | 1.80 | 2.67 | 1.73 | 1.97 |

| TFT parameter | nMOS | | pMOS | |
|---|---|---|---|---|
| | as fab. | after PII | as fab. | after PII |
| $\mu_{eff}$ (cm$^2$/Vs) | 3.16 | 32.6 | 1.66 | 10.06 |
| $V_{th}$ (V) | 14.8 | 1.35 | -17.7 | -11.6 |
| S (V/dec) | 2.55 | 0.82 | 2.91 | 1.68 |

FIG. 6

PLASMA ION IMPLANTATION HYDROGENATION PROCESS UTILIZING VOLTAGE PULSE APPLIED TO SUBSTRATE

FIELD OF THE INVENTION

This invention relates generally to semiconductor wafer processing and more particularly to hydrogenation processes for polysilicon and amorphous silicon transistors.

BACKGROUND OF THE INVENTION

Polysilicon (poly-Si) or amorphous silicon (a-Si) thin film transistors (TFTs) are typically utilized in the active pixel matrix and the peripheral circuits of large area flat panel liquid crystal displays. Such TFT devices are particularly useful because of the compatibility of these devices with the glass substrate of the display. Although both polysilicon and amorphous silicon may be used in the fabrication of TFTs, the higher mobility of carriers in polysilicon TFTs, in comparison with amorphous silicon TFTs, suggests that polysilicon TFTs most likely will be the choice for such flat displays for some time to come.

In general, TFTs are fabricated in the following manner. First, low pressure chemical vapor deposition (LPCVD) is used to deposit an undoped amorphous silicon layer upon a fused quartz substrate. The thickness of this amorphous silicon layer is approximately 1000 Å. The amorphous silicon layer is then polycrystallized by heating the substrate and amorphous silicon layer to about 600° C. in a nitrogen atmosphere. The crystalline silicon grain size in the polycrystalline or polysilicon layer, which results from this process, is typically about 0.2 µm. Next, a 1000 Å gate oxide layer and a 3500 Å polysilicon gate electrode layer are LPCVD deposited upon this polycrystalline layer. Source/ drain area and gate electrodes are then doped by self-aligned implantations. Finally a 7000 Å oxide layer is deposited by LPCVD.

The formation of the polysilicon layers results in the creation of grain boundary and intragranular defects which highly influence the characteristics of the devices fabricated by this process and result in a significant degradation in device performance. Recent studies have indicated that there are at least two types of trap states which result from these defects in polysilicon TFTs and which lead to the degradation of device performance. One type of trap state, near the midgap of the silicon band gap, is caused by the unpaired bonds which exist at each grain boundary. A second type of trap state, called a tail state, is caused by strained bonds within the polysilicon grains.

Although the mechanism is not well understood, passivation by hydrogenation during the fabrication process has been shown to reduce the density of these trap states and to improve device performance. Some experiments suggest that for polysilicon TFTs, the threshold voltage and subthreshold slope, which are most strongly affected by the density of midgap trap states caused by unpaired bonds at the grain boundaries, respond quickly to hydrogenation, while the leakage current and field-effect mobility, which are strongly affected by strained bond tail states, respond slower to hydrogenation.

For passivation by hydrogenation to remove the strained bond tail states, a higher hydrogen concentration is required than for the hydrogen passivation of the midgap trap states at the grain boundaries caused b angling bonds. This result occurs because the number of strained bonds is roughly two orders of magnitude greater than the number of dangling bonds at a gain boundary.

Although several hydrogenation methods have been investigated to improve the quality of polysilicon TFTs, such methods have typically resulted in much longer processing times (up to 16 hours) with only a limited improvement to TFT quality.

For example, hydrogenation methods presently being attempted for polysilicon TFT include immersing the polysilicon wafer in either a radiofrequency (RF) parallel plate hydrogen plasma or an electron cyclotron resonance (ECR) microwave hydrogen plasma. Typically, an RF hydrogen plasma treatment of the wafer requires a processing time in excess of 10 hours, while an ECR microwave hydrogen plasma treatment requires a processing time in excess of hours.

Further, in addition to long processing times, these two hydrogen plasma approaches have resulted in only a limited improvement in the TFT devices. For example, 16 hours of RF plasma hydrogenation for a small grain size nMOS polysilicon TFT resulted in the following changes in the device parameters. The voltage at which the device turns on, $V_{th}$, which should be as low as possible, showed only a 6 V decrease after hydrogenation. The field-effect mobility, $\mu_{eff}$, which is the velocity at which the carrier (electron or hole) can move in device channel (which determines the gain of the device and hence the speed of the device and its drive capability) and which should be as large as possible, showed only a factor of 3 increase after hydrogenation. Finally, the subthreshold swing, S, which determines how fast a device can transition from its off state to its on state and which should be as small as possible, showed only a 1.0 V/decade decrease after hydrogenation.

The lack of improvement associated with these two approaches appears to result from the limited diffusion of hydrogen through the surface of the wafer; the small sheath potential which results in a low hydrogen ion current; and the accumulation of surface charge on the insulating substrate which contributes to preventing hydrogen ions from penetrating into the wafer. The typical substrate bias of hundreds of volts in the case of the RF hydrogen plasma and tens of volts in the case of the ECR microwave hydrogen plasma are too low to accelerate enough hydrogen ions through the surface charge and into the device channels in the wafer.

Although the conventional technique of ion implantation can also, in principal, be used for hydrogenation, ion implantation typically has an extremely high cost and low efficiency due to the large size of the wafer being implanted and the resulting long times required to scan the wafer with the hydrogen ion beam. Further, ion beam implantation hydrogenation has not resulted in a significant improvement in TFT performance. This lack of improvement is possibly due to the fact that hydrogen ions cannot be directly sent to the device channel area through the gate oxide by ion beam implantation. Hydrogen ions cannot be directly implanted because to do so would result in damage to the gate oxide and the channel lattice and a low annealing temperature, which should be lower than the melting points of either the glass substrate or aluminum interconnection, cannot correct the lattice damage.

A way that has been attempted to avoid this problem is to adjust the hydrogen ion energy so as to send the hydrogen ions into the polysilicon gate layer while keeping away from the gate oxide layer. Because of the nonplanar structure of the device, ions implanted near the edge of the gate, that is, near the corners of the source or drain and channel, are closer to channel area. This is due to the fact that the vertical distance to the surface at these locations is less than the vertical distance to the surface above the channel.

Following hydrogen ion implantation, post-implantation annealing is performed in an attempt to cover the whole channel through the lateral diffusion of the hydrogen ions. However, due to the vertical orientation of ion beam used in implantation, the typical hydrogen ion dose (approximately $1 \times 10^{17}/cm^2$) in the small area near the edge of gate may be not enough to passivate the whole channel.

For example, the depth of penetration for a 10 keV hydrogen ion implantation for a silicon target is approximately 1500 Å. However, the vertical distance between device channel and the top of the TFT, for example, in one device is greater than 1.15 μm (1000 Å gate $SiO_2$+3500 Å polysilicon gate+7000 Å $SiO_2$). Thus the shortest distance between the surface and the active channel is through an 8000 Å $SiO_2$ layer measured from the gate edges. Through this path, hydrogen may then reach the active channel by diffusing laterally. Thus, even with this reduced path length, a 100 keV hydrogen ion implantation is required to reach the active channel.

Finally, a pure diffusion process can not be used to passivate the defects. Although a pure diffusion process will not damage the devices, as the hydrogen implantation just discussed will, a pure diffusion process operating at 300°–400° C. cannot bring enough hydrogen ions (up to $1 \times 10^{17}/cm^2$ dose being required) to the device channel except after very long periods of exposure. The long times required for pure diffusion to bring a sufficient number of hydrogen ions to the device channel make such a process unacceptable for manufacturing purposes.

Thus a hydrogenation process is desired which will not damage the devices on the wafer and yet will not require the long exposure times typical of diffusion processes.

SUMMARY OF THE INVENTION

The invention relates to a method of hydrogenating a thin film semiconductor wafer and an apparatus for performing the method. In one embodiment the method comprises the steps of applying a pulsed potential having a predetermined amplitude, a predetermined repetition rate and a predetermined pulse duration to the thin film semiconductor wafer while exposing the thin film semiconductor wafer to a hydrogen plasma.

An apparatus for hydrogenating a TFT wafer includes a magnetic bucket including a magnetically permeable vacuum chamber having a substantially cylindrical shape and enclosed by a first end and a second end. An even plurality of magnets having alternating polarity are located adjacent to and equally spaced about the exterior circumference of the magnetically permeable vacuum chamber. A gas source supplies hydrogen gas into the magnetically permeable vacuum chamber. A vacuum pump is in communication with the magnetically permeable vacuum chamber, and a conductive wafer holder is located within the magnetically permeable vacuum chamber. A microwave source provides microwaves to the interior of the magnetically permeable chamber through a quartz window. A high voltage pulse generator in electrical communication with the conductive wafer holder applies a pulse potential to the wafer holder. The pulse potential has a predetermined amplitude, a predetermined repetition rate and a predetermined pulse duration.

BRIEF DESCRIPTION OF THE DRAWINGS

This invention is pointed out with particularity in the appended claims. The above and further advantages of this invention may be better understood by referring to the following description taken in conjunction with the accompanying drawing, in which:

FIG. 5 is a table of measurements of various parameters of nMOS and pMOS devices hydrogenated by another embodiment of the method of the invention: prior to processing by the method of the invention; following processing by the method of the invention; and following processing by the method of the invention with subsequent annealing;

FIG. 6 is a table of measurements of various parameters of nMOS and pMOS devices hydrogenated by another embodiment of the method of the invention: prior to processing by the method of the invention and following processing by the method of the invention;

DETAILED DESCRIPTION OF THE INVENTION

In general overview, in one embodiment of the hydrogenation process of the invention, a polysilicon thin film transistor wafer is immersed in a hydrogen plasma and a series of negative high voltage pulse are applied to the wafer. The hydrogen ions in the plasma around the wafer are accelerated by the pulse potential and become implanted into the wafer.

Figure 1:
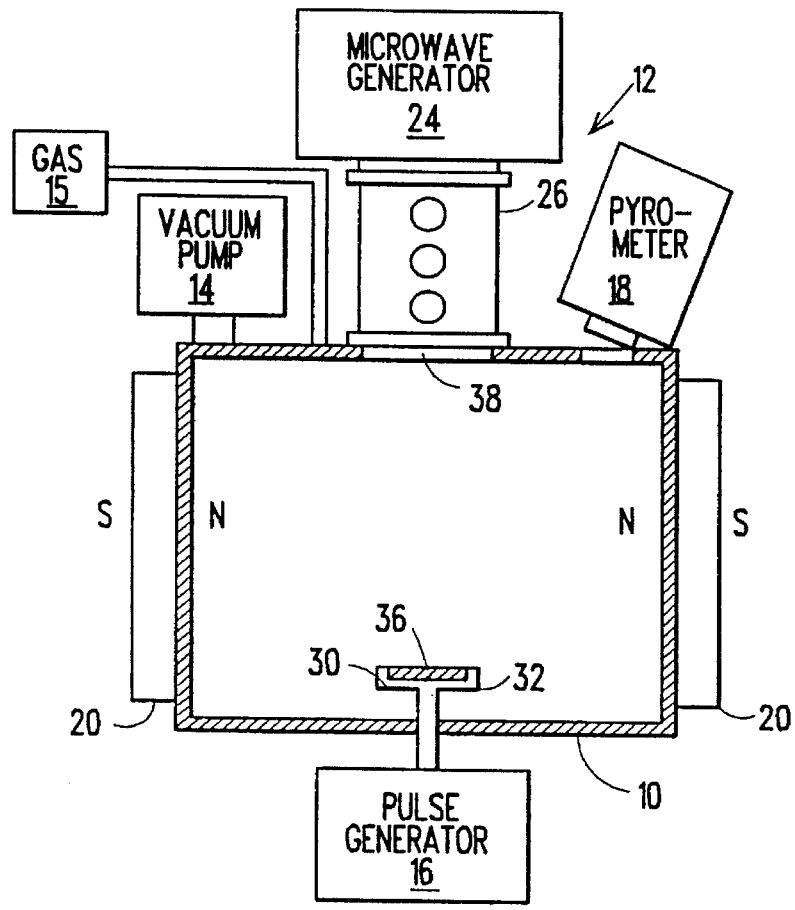
FIG. 1 is a side view of an embodiment of a hydrogenation apparatus of the invention.
Figure 2:
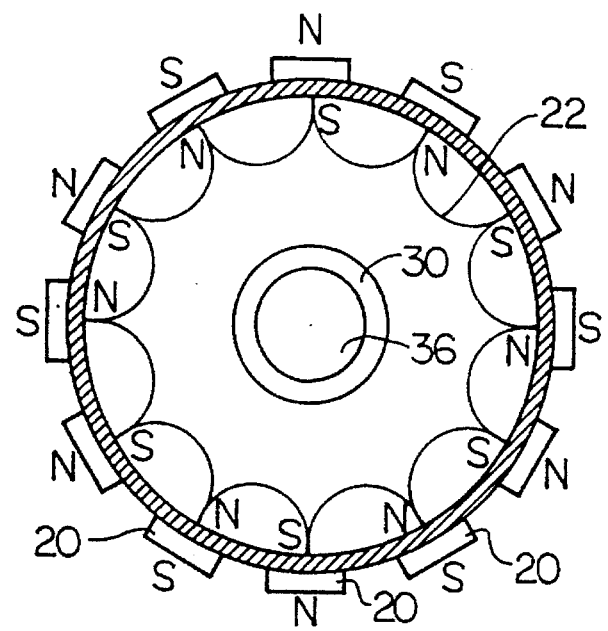
FIG. 2 is a top view of the hydrogenation apparatus of FIG. 1.

More specifically, one embodiment of the method of the invention for hydrogenating CMOS polysilicon TFTs using mild-temperature polysilicon processing utilizes an embodiment of a microwave multipolar container plasma ion implantation apparatus depicted in FIGS. 1 and 2. The microwave multipolar container plasma ion implantation apparatus includes a vacuum chamber 10 having a multipolar magnetic field incorporated within, a microwave source 12, a vacuum system 14, gas handling system 15, a high voltage pulse generator 16, and a temperature measuring device 18.

Considering each component individually, the vacuum chamber 10, in one embodiment, is a cylindrical aluminum chamber approximately 30 cm high and 36 cm in diameter. Attached to the outside wall of the vacuum chamber 10 is an even number of permanent magnetic bars 20, each producing, in one embodiment, a magnetic field of about 1000 gauss at it's pole. These magnetic bars 20 are arranged such that successive north and south poles face the interior of the vacuum chamber 10 to thereby confine any plasma within the vacuum chamber 10 within a multipolar magnetic field 22. This chamber construction is referred to as a magnetic bucket. Although permanent magnets are used in this embodiment, electromagnets may be used to create the field.

The number of magnets and the field strength of each magnet are chosen such that there is a substantially uniform ion density in a radial direction in the vicinity of the target wafer at the cylindrical axis of the magnetic bucket. The benefits of using this form of magnetic bucket are that a higher ion density and a better radial ion density uniformity are obtained in the chamber because the electrons are reflected back into the plasma by the magnetic field instead of being lost to the chamber walls. In principle, the lower the magnetic field strength used, the smaller the chamber size that can be used to obtain the same ion uniformity over the target wafer. For example, using the chamber dimensions and magnet strengths just described, the ion density deviated less than 5% over the surface of a three inch diameter wafer.

Although any material permeable to a magnetic field may be used for the chamber 10, aluminum is preferable to stainless steel for several reasons. First of all, the aluminum oxide, $Al_2O_3$, coating which forms on the inside of the chamber resists ion sputtering. Further, any aluminum sputtering which does occur has less of a detrimental effect on the semiconductor devices being processed than does any iron sputtering which occurs when stainless steel is used. This is due to the fact that iron has a deep energy level in the silicon band gap which results primarily in increased leakage current across the pn junction.

The microwave source 12, in one embodiment, an Applied Science and Technology, Inc. Woburn, Mass., ASTeX Model S-1000, includes a magnetron generator 24 and a three-stub tuner 26. The magnetron generator 24 can supply up to 1000 Watts of continuous wave power at a frequency of 2.45 GHz. A waveguide directs the microwave power through a quartz window 38 and into the chamber 10.

Located within the vacuum chamber 10 is a stainless steel wafer holder 30 encased in quartz 32 to minimize contamination. The wafer holder 30 ms positioned in line with the three-stub tuner 26 so as to receive the microwave energy entering the vacuum chamber 10 from the tuner 26 through quartz window 38.

A pulse generator 16, in one embodiment a VELONEX, Santa Clara, Calif., Model 570 is connected to the wafer holder 30 so as to apply a series of high voltage negative pulses to a silicon wafer 36 located in the wafer holder 30. The pulse repetition rate, the pulse amplitude and the pulse width are individually adjustable.

The temperature of the stainless steel wafer holder 30, in one embodiment, is controlled to an optimal value by modifying the implantation of the hydrogen ions by adjusting such parameters as microwave power, pulse repetition rate and pulse width. Additionally a heated/cooled wafer holder may be constructed, to further control the temperature of the target, without constraining the remaining system parameters.

During the hydrogenation process, the temperature measuring device 18, in one embodiment an infrared pyrometer, is used to monitor the surface temperature of the wafer 36, so that the temperature of the wafer can be optimized. In one embodiment the wafer is maintained to 350° C., the temperature at which the wafer would normally be annealed.

A wafer is mounted on the wafer holder 30 within the vacuum chamber 10 and the pressure in the vacuum chamber 10 reduced to approximately $10^{-6}$ Torr. At this point enough hydrogen is introduced to raise the pressure within the vacuum chamber 10 to approximately 50 mTorr. The hydrogen gas is ionized into a plasma by the microwave radiation emitted from the microwave generator 24. The typical hydrogen plasma so generated in this system has a plasma density of $10^{10}/cm^3$, an electron temperature of 1.5 eV, and a plasma potential of 10 V.

A pulsed potential of from −1 kV to −20 kV at a repetition rate of from 1 kHz to 20 kHz is applied to the wafer holder 30. The pulse voltage should not exceed −20 kV, since at higher potentials there is a danger of damaging the device structure due to the high energy imparted to the hydrogen ions. Further, the pulse repetition rate is limited by the time it takes for hydrogen ions to move back into the sheath space by ambipolar diffusion following the depletion of hydrogen ions by a pulse. The upper limit for the pulse repetition rate, which is the function of process conditions, is about 19.7 kHz when the hydrogen ion density is $1\times10^{10}/cm^3$, the pulse potential is 20 kV, and the pulse width is 20 µsec.

In addition to the pulse repetition rate, the pulse width may be varied from 1 to 50 µsec. Although the lower limit of the pulse width depends upon the rise time of pulse which is in turn limited by the electronics of the pulse generator, there is a limitation for upper limit of pulse width which is determined by the physics of the plasma.

During the pulse, there is a dynamic expansion of the plasma sheath. In order to avoid plasma collapse, the greatest sheath thickness should be smaller than the distance between target and chamber wall. The sheath thickness in the presence of a pulse is the function of process conditions. For example, the sheath is 18 cm when the hydrogen ion density is $1\times10^{10}/cm^3$, the pulse potential is 20 kV, and the pulse width is 20 µsec. Thus the pulse width must not so great that the resulting expansion of the sheath causes the plasma to collapse.

The wafer to be hydrogenated is exposed to the hydrogen ion plasma for between 0.5 and 10 minutes under the conditions just recited. Having provided a general recitation of the method of the invention, the following examples will demonstrate the effects of hydrogenation by the method of the invention.

EXAMPLE 1

In this example, the microwave power applied to a wafer having devices with a W/L (channel width to channel length) ratio of 50 µ/10 µ is approximately 600 W. The base pressure of the vacuum chamber is approximately $10^{-6}$ Torr with hydrogen introduced to a pressure of approximately 50 mTorr. A pulse potential of approximately −6 kV is applied to the wafer with a pulse width of approximately 20 µsec and a pulse repetition rate of approximately 500 Hz. The implanted hydrogen dose is approximately $10^{17}/cm^2$. The surface temperature of sample is monitored at 295° C. during the processing. After about 50 minutes of hydrogen plasma processing and 15 minute post-implant annealing at 350° C., the performance of a nMOS and pMOS TFTs, which is substantially independent of the device W/L ratio, is as follows:

In the treated nMOS TFT devices, the threshold voltage $V_{th}$ was dramatically decreased from 15.8 to 6.9 V, the field-effect carrier mobility $\mu_{eff}$ was increased by almost an order of magnitude from 1.99 to 20 $cm^2/V$ sec, and the subthreshold swing (S) was also decreased from 2.00 to 1.80 V/decade.

Similarly the performance of pMOS TFT devices was also improved, although to a less degree than the improvement in the nMOS TFT devices. Specifically, after hydrogenation and annealing, the threshold voltage, $V_{th}$, for the pMOS TFT devices was decreased 3.2 V from −19.4 V to −16.2 V, the field-effect carrier mobility, $\mu_{eff}$, was increased a factor of four from 0.55 to 2.31 cm$^2$/V sec, and the subthreshold swing (S) was decreased from 2.23 to 1.51 V/decade.

Figures 3, 4:
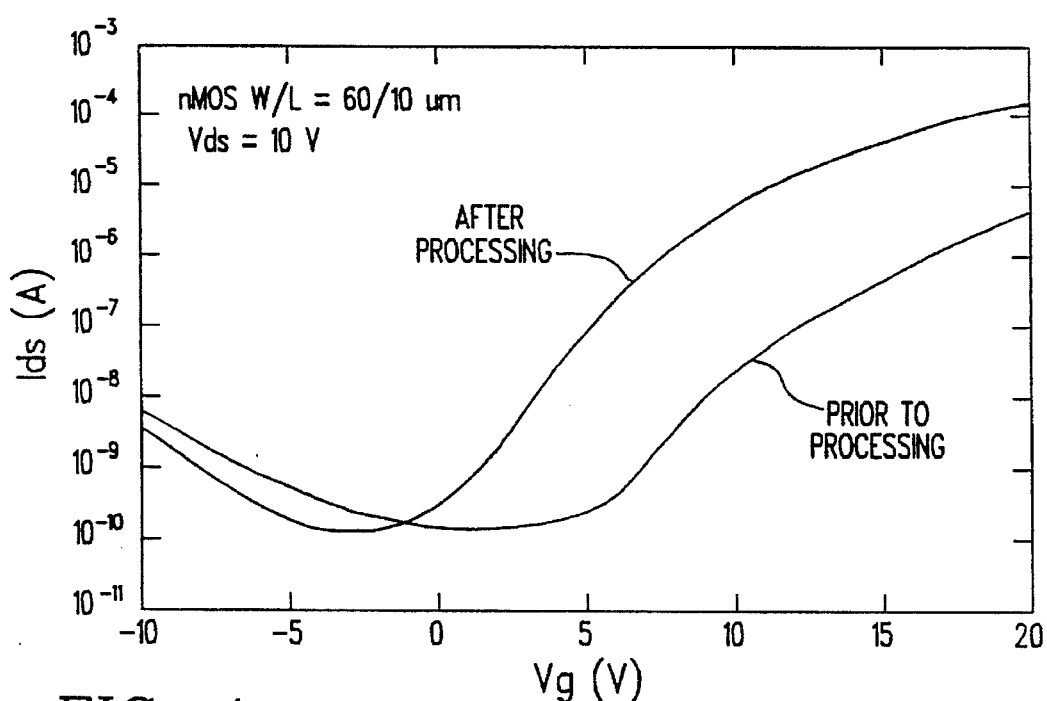
FIG. 3 is a table of measurements of various parameters of nMOS and pMOS devices hydrogenated by an embodiment of the method of the invention: prior to processing by the method of the invention; following processing by the method of the invention; and following processing by the method of the invention with subsequent annealing.
FIG. 4 is a graph of the $I_{ds}$ v $V_g$ curves for an nMOS TFT prior to and following processing by the embodiment of method of the invention whose results are shown in FIG. 3.

The improvement in the characteristics of the nMOS and pMOS TFT devices after hydrogenation by the process of the invention as exemplified by example 1 are summarized in the table of FIG. 3. The improvement in nMOS TFT device performance is further indicated by the significant shift to the left of the $I_{ds}$ v $V_g$ curve and by the different shape of the curve as shown in FIG. 4.

EXAMPLE 2

A second embodiment of the hydrogenation process was used which resulted in an even greater increase in performance with yet a further decrease in processing time. In this embodiment, the microwave power was increased to 730 W, while the pulse width was shortened to about 10 μsec, and the pulse repetition rate increased to 2000 Hz. The pulse potential remained at −6 kV. The optimum surface temperature of sample was monitored at 380° C. during the processing. Under these conditions, after 10 minutes of process time, the implanted hydrogen dose is approximately $1 \times 10^{17}$/cm$^2$, which is the same as Example 1.

As a result of this processing, the performance of both nMOS and pMOS TFTs was improved significantly. The improvement in the characteristics of the nMOS and pMOS TFT devices after hydrogenation by the process of the invention as exemplified by example 2 is summarized in the table of FIG. 5.

EXAMPLE 3

In a third embodiment a greater improvement in the characteristics of the devices is obtained without the step of post-implant annealing. In this embodiment the microwave power is 730 W, base chamber pressure is $10^{-6}$ Torr, the working hydrogen pressure is about 50 mTorr, the pulse potential is about −7 kV, the pulse width is about 5 μsec, and the pulse repetition rate is about 5000 Hz. The surface temperature of sample is monitored at 380° C. during the processing which continues approximately 30 minutes. As a result of these conditions the dose rate is increased and the total hydrogen dose is increased from $1 \times 10^{17}$ to $6 \times 10^{17}$/cm$^2$. Post-implant annealing process does not increase the performance of the TFTs under these conditions.

Figure 7:
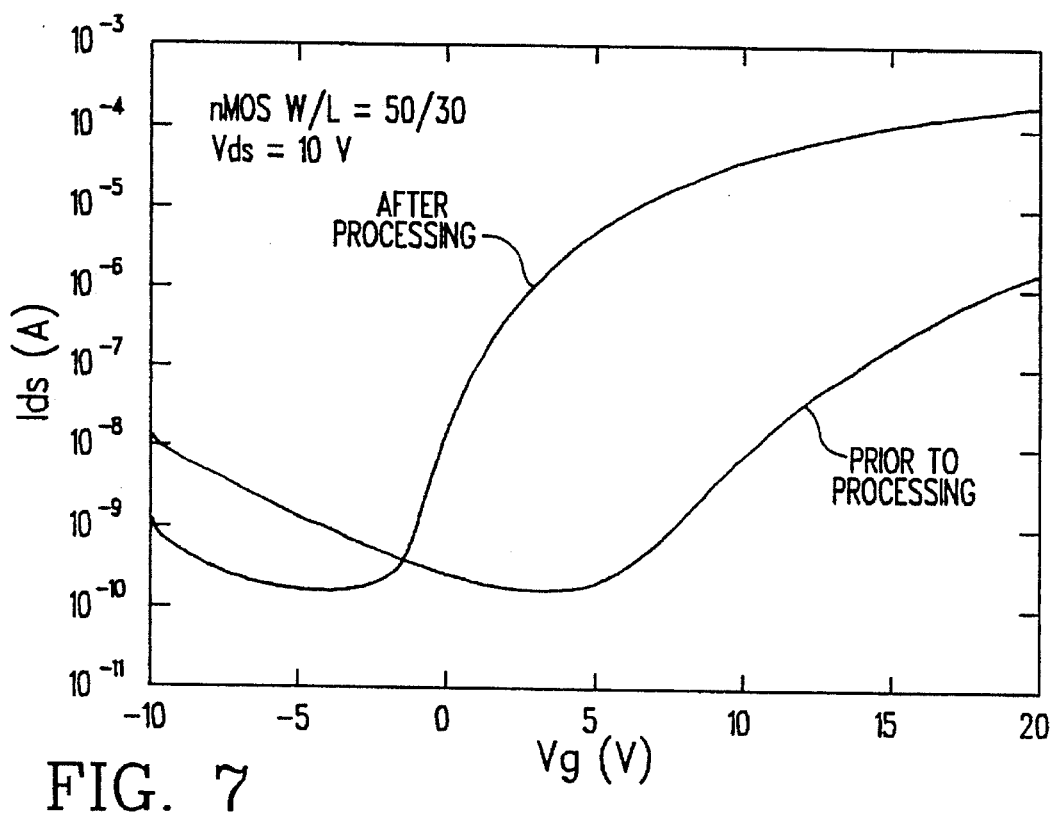
FIG. 7 is a graph of the $I_{ds}$ v $V_g$ curves for an nMOS TFT prior to and following processing by the embodiment of method of the invention whose results are shown in FIG. 6.

After the hydrogenation process just described, the performance of both nMOS and pMOS polysilicon TFTs (in this example, having a device channel width to channel length ratio (W/L) of 50 μm/30 μm) show significant improvement. In the treated nMOS TFT device, the threshold voltage $V_{th}$ is dramatically decreased 13.5 V from 14.8 to 1.35 V, the field-effect carrier mobility $\mu_{eff}$ is increased 10.3 times from 3.16 to 32.6 cm$^2$/V sec. and the subthreshold swing, S, is decreased from 2.55 to 0.82 V/decade. The improvement in the performance characteristics of an nMOS TFT after the hydrogenation process described in example 3, is shown in tabular form in FIG. 6 and is further demonstrated by the significant shift to the left of the $I_{ds}$ v $V_g$ curve and by the different shape of the curve for an nMOS TFT after hydrogenation as shown in FIG. 7.

Figure 8:
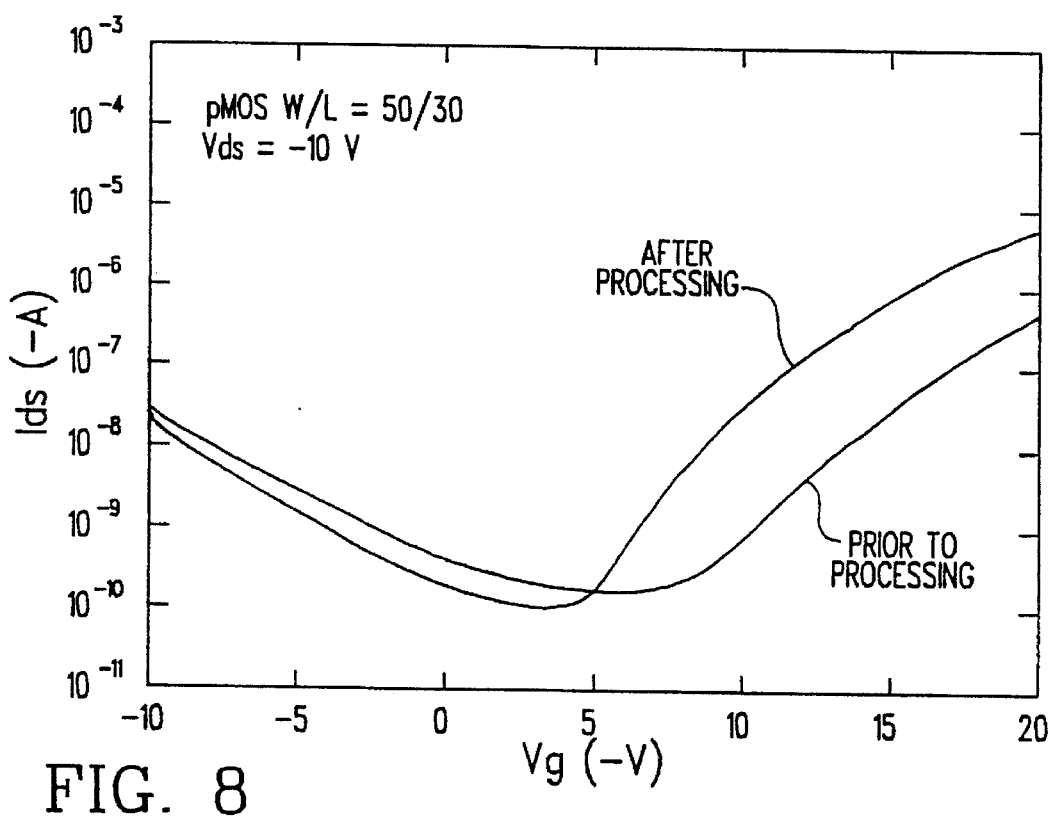
FIG. 8 is a graph of the $I_{ds}$ v $V_g$ curves for a pMOS TFT prior to and following processing by the embodiment of method of the invention whose results are shown in FIG. 6.

The performance of pMOS TFT is also significantly improved by the process of example 3, although not to as great a degree as the nMOS TFT. After this processing, the threshold voltage, $V_{th}$, is decreased 6.1 V, from −17.7 to −11.6 V, the carrier mobility, $\mu_{eff}$, is increased 6.1 times, from 1.66 to 10.06 cm$^2$/V sec, and the subthreshold swing, S, is decreased from 2.91 to 1.68 V/decade. The improvement in the performance characteristics of a pMOS TFT after hydrogenation by the process of the invention is also summarized in the table of FIG. 6. FIG. 8 provides a comparison of $I_d$ vs. $V_g$ curves for a pMOS TFT before and after the hydrogenation processing of the invention.

EXAMPLE 4

In yet another embodiment, the pulse repetition rate is increased to 10 kHz and the pulse width set to about 10 μsec. With the remaining parameters maintained as in example 3, the processing time is reduced to 10 minutes from 30 minutes while the same improvement in device characteristics is obtained.

The results of the above three examples demonstrate that by increasing the dose rate, the processing time can be decreased. This is due to the fact that the performance of TFTs is determined by the hydrogen dose involved in the active channel of device.

There are several ways to increase the dose rate. In one embodiment, the pulse repetition rate is increased, in another embodiment, the ion density is increased, and in a third embodiment, the pulse voltage is increased. However, the pulse voltage can not be allowed to increase to too great an extent because the device may be damaged. Further, since the maximum ion density is typically limited by the ion source, increasing the pulse repetition rate is a very effective way to reduce the processing time.

Therefore the hydrogenation method of the invention offers a significant improvement in device performance with a substantial decrease in possessing time.

Having shown the preferred embodiment, those skilled in the art will realize many variations are possible which will still be within the scope and spirit of the claimed invention. Therefore, it is the intention to limit the invention only as indicated by the scope of the claims.

What is claimed is:

1. A method of hydrogenating a TFT wafer comprising the steps of:

placing a TFT wafer in a vacuum chamber;

permitting a volume of hydrogen gas to enter said vacuum chamber to a pressure;

ionizing at least a portion of said volume of hydrogen gas to form a hydrogen ion plasma;

confining said hydrogen ion plasma at a substantially uniform density to a region adjacent said TFT wafer;

applying a negative pulse potential to said TFT wafer, said pulse potential having a constant amplitude, a repetition rate and a pulse duration; and exposing said TFT wafer with said pulsed potential to said hydrogen ion plasma for an amount of time.

2. The method of hydrogenating a TFT wafer of claim 1 wherein said hydrogen plasma is formed using a microwave source operating between about 600 W and 730 W.

3. The method of hydrogenating a TFT wafer of claim 2 wherein said hydrogen plasma is formed using a microwave source operating at about 730 W.

4. The method of hydrogenating a TFT wafer of claim 1 wherein said pulse duration is between about 1 μsec and 50 μsec.

5. The method of hydrogenating a TFT wafer of claim 4 wherein said pulse duration is between about 5 μsec and 10 μsec.

6. The method of hydrogenating a TFT wafer of claim 1 wherein said pulse repetition rate is between about 0.5 kHz and 20 kHz.

7. The method of hydrogenating a TFT wafer of claim 6 wherein said pulse repetition rate is between about 5 kHz and 10 kHz.

8. The method of hydrogenating a TFT wafer of claim 1 wherein said pulse potential amplitude is between about −1 kV and −20 kV.

9. The method of hydrogenating a TFT wafer of claim 8 wherein said pulse potential amplitude is between about −6 kV and −7 kV.

10. The method of hydrogenating a TFT wafer of claim 1 wherein said time is less than 1 hour.

11. The method of hydrogenating a TFT wafer of claim 10 wherein said time is between 10 minutes and 30 minutes.

* * * * *